(12) United States Patent
Askew et al.

(10) Patent No.: US 7,259,499 B2
(45) Date of Patent: Aug. 21, 2007

(54) PIEZOELECTRIC BIMORPH ACTUATOR AND METHOD OF MANUFACTURING THEREOF

(76) Inventors: Andy R. Askew, 3610 Dunhurst Dr., Pfafftown, NC (US) 27040; Gregory S. Lyon, 907 Stuart Ave., Mamaroneck, NY (US) 10543

( * ) Notice: Subject to any disclaimer, the term of this patent is extended or adjusted under 35 U.S.C. 154(b) by 0 days.

(21) Appl. No.: 11/262,004

(22) Filed: Oct. 28, 2005

(65) Prior Publication Data
US 2006/0138903 A1   Jun. 29, 2006

Related U.S. Application Data

(60) Provisional application No. 60/638,559, filed on Dec. 23, 2004.

(51) Int. Cl.
*H01L 41/053* (2006.01)
(52) U.S. Cl. ............... 310/328; 310/324; 310/332; 310/344; 310/348
(58) Field of Classification Search ........... 310/328, 310/332, 348, 330, 337, 324, 331, 340, 341, 310/344, 349, 351
See application file for complete search history.

(56) References Cited

U.S. PATENT DOCUMENTS

| | | | |
|---|---|---|---|
| 4,699,682 A | 10/1987 | Takishima | |
| 4,725,003 A | 2/1988 | Lange | |
| 4,737,767 A | 4/1988 | Kompanek et al. | |
| 4,742,182 A | 5/1988 | Fuchs | |
| 4,763,148 A * | 8/1988 | Tsukimoto et al. | 396/133 |
| 4,769,795 A | 9/1988 | Massa et al. | |
| 4,807,294 A | 2/1989 | Iwata et al. | |
| 4,823,802 A | 4/1989 | Romanovskaya | |
| 4,849,668 A | 7/1989 | Crawley et al. | |
| 4,850,534 A | 7/1989 | Takahashi et al. | |
| 4,857,887 A | 8/1989 | Iten | |
| 4,859,897 A | 8/1989 | Massa | |
| 4,869,278 A | 9/1989 | Bran | |
| 4,878,057 A | 10/1989 | Kompanek et al. | |
| 4,906,917 A | 3/1990 | Olness et al. | |
| 4,920,296 A | 4/1990 | Takahashi et al. | |
| 4,939,405 A | 7/1990 | Okuyama et al. | |
| 4,952,836 A | 8/1990 | Robertson | |
| 4,958,101 A | 9/1990 | Takahashi et al. | |
| 4,991,150 A | 2/1991 | Wixom | |
| 4,998,549 A | 3/1991 | Bran | |
| 5,003,824 A | 4/1991 | Fukada et al. | |

(Continued)

OTHER PUBLICATIONS

Definition of polyester from The American Hertiage Dictionary of the English Language: Fourth Edition, 2000.*

(Continued)

*Primary Examiner*—Darren Schuberg
*Assistant Examiner*—Derek Rosenau
(74) *Attorney, Agent, or Firm*—Carter, DeLuca, Farrell & Schmidt, LLP

(57) ABSTRACT

An actuator is disclosed, which includes a piezoelectric bimorph. The actuator also includes a substantially moisture impervious and electrically insulating packaging having a cavity around the bimorph providing for a clearance around the bimorph. The packaging includes a carrier having first and second surfaces and an aperture wherein the bimorph is disposed, the packaging further includes first and second cover films selectively attached to the first and second surfaces respectively, and at least one flex circuit connected to the bimorph for supplying electrical energy thereto.

25 Claims, 3 Drawing Sheets

U.S. PATENT DOCUMENTS

| | | | |
|---|---|---|---|
| 5,029,375 A | 7/1991 | Fishman | |
| 5,050,128 A | 9/1991 | Saitoh et al. | |
| 5,113,108 A | 5/1992 | Yamashita et al. | |
| 5,118,980 A | 6/1992 | Takahashi | |
| 5,121,024 A | 6/1992 | Seto | |
| 5,148,077 A | 9/1992 | Grawey et al. | |
| 5,159,228 A | 10/1992 | Schaetzle | |
| 5,166,570 A | 11/1992 | Takahashi | |
| 5,184,043 A | 2/1993 | Yoshinaga | |
| 5,196,755 A | 3/1993 | Shields | |
| 5,198,716 A * | 3/1993 | Godshall et al. | 310/349 |
| 5,216,317 A | 6/1993 | Rydborn | |
| 5,235,237 A * | 8/1993 | Leonhardt | 310/329 |
| 5,239,223 A | 8/1993 | Miyoshi | |
| 5,271,133 A | 12/1993 | Dam et al. | |
| 5,305,507 A | 4/1994 | Dvorsky et al. | |
| 5,319,153 A | 6/1994 | Fishman | |
| 5,332,944 A | 7/1994 | Cline | |
| 5,339,291 A | 8/1994 | Libuha et al. | |
| 5,353,621 A | 10/1994 | Knecht et al. | |
| 5,355,048 A | 10/1994 | Estes | |
| 5,357,164 A | 10/1994 | Imabayashi et al. | |
| 5,357,662 A | 10/1994 | Takagi et al. | |
| 5,365,960 A | 11/1994 | Bran | |
| 5,389,851 A | 2/1995 | Kimura et al. | |
| 5,410,789 A | 5/1995 | Noto et al. | |
| 5,412,621 A | 5/1995 | Hepp | |
| 5,414,917 A | 5/1995 | Tanaka | |
| 5,436,523 A | 7/1995 | Staudte | |
| 5,447,845 A | 9/1995 | Chu et al. | |
| 5,449,965 A | 9/1995 | Tsuru | |
| 5,455,477 A | 10/1995 | Sano et al. | |
| 5,457,353 A | 10/1995 | Thurn et al. | |
| 5,478,756 A | 12/1995 | Gizeli et al. | |
| 5,504,980 A | 4/1996 | Yoshinaga et al. | |
| 5,541,557 A | 7/1996 | Ikeda et al. | |
| 5,545,942 A | 8/1996 | Jaster et al. | |
| 5,549,926 A | 8/1996 | Miyamoto | |
| 5,550,790 A | 8/1996 | Velamoor et al. | |
| 5,568,006 A | 10/1996 | Luff et al. | |
| 5,568,679 A | 10/1996 | Ohya et al. | |
| 5,578,890 A | 11/1996 | Vig | |
| 5,593,721 A | 1/1997 | Daidai et al. | |
| 5,596,244 A | 1/1997 | Kugou et al. | |
| 5,597,610 A | 1/1997 | Miura | |
| 5,623,236 A | 4/1997 | Yoshinaga et al. | |
| 5,629,578 A | 5/1997 | Winzer et al. | |
| 5,656,882 A | 8/1997 | Lazarus et al. | |
| 5,674,258 A | 10/1997 | Henschel et al. | |
| 5,687,462 A | 11/1997 | Lazarus et al. | |
| 5,702,775 A | 12/1997 | Anderson et al. | |
| 5,705,399 A | 1/1998 | Larue | |
| 5,747,672 A | 5/1998 | Parent et al. | |
| 5,760,526 A | 6/1998 | Anderson | |
| 5,771,555 A * | 6/1998 | Eda et al. | 29/25.35 |
| 5,793,150 A | 8/1998 | Kober et al. | |
| 5,808,397 A | 9/1998 | Kotani | |
| 5,814,525 A | 9/1998 | Renschler et al. | |
| 5,825,120 A | 10/1998 | Maesaka et al. | |
| 5,828,159 A | 10/1998 | Miyagawa et al. | |
| 5,831,369 A | 11/1998 | Furbacher et al. | |
| 5,838,093 A | 11/1998 | Sukai et al. | |
| 5,844,348 A | 12/1998 | Gamo | |
| 5,844,349 A | 12/1998 | Oakley et al. | |
| 5,847,488 A | 12/1998 | Yoshida et al. | |
| 5,847,490 A | 12/1998 | Kumasaka et al. | |
| 5,889,871 A | 3/1999 | Downs, Jr. | |
| 5,892,417 A | 4/1999 | Johnson et al. | |
| 5,894,651 A | 4/1999 | Dvorsky et al. | |
| 5,917,437 A | 6/1999 | Ojala et al. | |
| 5,918,354 A | 7/1999 | Ikegami et al. | |
| 5,920,145 A | 7/1999 | Wu et al. | |
| 5,949,294 A | 9/1999 | Kondo et al. | |
| 5,969,461 A | 10/1999 | Anderson et al. | |
| 5,986,386 A | 11/1999 | Jaenker | |
| 6,005,329 A | 12/1999 | Ikeda et al. | |
| 6,031,318 A | 2/2000 | Sunaga et al. | |
| 6,033,852 A | 3/2000 | Andle et al. | |
| 6,046,529 A * | 4/2000 | Yoshida et al. | 310/348 |
| 6,058,020 A | 5/2000 | Winterer et al. | |
| 6,064,282 A | 5/2000 | Futakuchi et al. | |
| 6,069,433 A | 5/2000 | Lazaarus et al. | |
| 6,093,996 A | 7/2000 | Daidai et al. | |
| 6,118,207 A | 9/2000 | Ormerod et al. | |
| 6,126,818 A | 10/2000 | Duerrstein et al. | |
| 6,141,844 A | 11/2000 | Miyagawa et al. | |
| 6,150,748 A | 11/2000 | Fukiharu | |
| 6,198,206 B1 | 3/2001 | Saarmaa et al. | |
| 6,198,207 B1 | 3/2001 | Lally et al. | |
| 6,204,593 B1 | 3/2001 | Takahashi et al. | |
| 6,215,227 B1 | 4/2001 | Boyd | |
| 6,215,231 B1 | 4/2001 | Newnham et al. | |
| 6,262,513 B1 | 7/2001 | Furukawa et al. | |
| 6,274,966 B1 | 8/2001 | Kohno et al. | |
| 6,274,969 B1 | 8/2001 | Gamo | |
| 6,285,114 B1 | 9/2001 | Sawin | |
| 6,310,421 B2 | 10/2001 | Morishima | |
| 6,313,569 B1 | 11/2001 | Sawai et al. | |
| 6,316,864 B1 | 11/2001 | Ormerod | |
| 6,344,706 B1 | 2/2002 | Morita et al. | |
| 6,404,107 B1 | 6/2002 | Lazarus et al. | |
| 6,407,485 B1 | 6/2002 | Aratake | |
| 6,420,819 B1 | 7/2002 | Lazarus et al. | |
| 6,457,220 B1 | 10/2002 | Hamano | |
| 6,467,139 B1 | 10/2002 | Tanaka | |
| 6,512,323 B2 * | 1/2003 | Forck et al. | 310/332 |
| 6,528,924 B1 | 3/2003 | Stelzl et al. | |
| 6,539,952 B2 | 4/2003 | Itzkowitz | |
| 6,541,897 B2 | 4/2003 | Endoh | |
| 6,548,942 B1 | 4/2003 | Panasik | |
| 6,552,472 B1 | 4/2003 | Heinz | |
| 6,556,105 B1 | 4/2003 | Nguyen et al. | |
| 6,589,798 B1 | 7/2003 | Lofas | |
| 6,653,762 B2 | 11/2003 | Takeshima | |
| 6,661,162 B1 | 12/2003 | Nagai et al. | |
| 6,700,308 B2 | 3/2004 | Heinz | |
| 6,700,313 B2 | 3/2004 | Dalla Piazza et al. | |
| 6,703,766 B2 | 3/2004 | Duerr | |
| 6,703,767 B1 | 3/2004 | Summers | |
| 6,744,178 B2 | 6/2004 | Muramatsu et al. | |
| 6,744,179 B2 | 6/2004 | Wajima et al. | |
| 6,747,400 B2 | 6/2004 | Maichl et al. | |
| 6,761,831 B2 | 7/2004 | Borchers et al. | |
| 6,781,285 B1 | 8/2004 | Lazarus et al. | |
| 6,784,598 B2 | 8/2004 | Kaida | |
| 7,161,276 B2 * | 1/2007 | Face | 310/314 |
| 2004/0075364 A1 * | 4/2004 | Mehta | 310/324 |

OTHER PUBLICATIONS

International Search Report PCT/US05/45363 dated Jul. 27, 2006.

* cited by examiner

PIEZOELECTRIC BIMORPH ACTUATOR AND METHOD OF MANUFACTURING THEREOF

CROSS REFERENCE TO RELATED APPLICATION

The present application claims a benefit of priority to U.S. Provisional Application Ser. No. 60/638,559 filed on Dec. 23, 2004 entitled "Encapsulation of Piezo Electric Bimorph" by Andy R. Askew and Gregory S. Lyon, the entire contents of which being incorporated by reference herein.

BACKGROUND

1. Field

The present disclosure relates generally to actuators, more specifically, to piezoelectric bimorph actuators encased in an insulating shell to ensure that the actuator is substantially moisture impervious.

2. Description of the Related Art

Bimorphs are piezoelectric elements which change their shape under application of electrical energy. Bimorphs are widely used in a variety of actuators, such as in shutter mechanisms of cameras, head assemblies of hard drive disks, etc. In particular, bimorph type actuators are also used in gas transducers. Gas transducers are utilized in a variety of industries, such as pipeline, chemical, distillery, food processing, petrochemical, pharmaceutical and other industries where precise control of various valves and other equipment is desired. Gas transducers operate by controlling gas flow and/or pressure, which in turn actuates other equipment (e.g., valves, louvers, etc.). However, use of piezoelectric bimorph actuators where the gas stream may contain a significant amount of moisture can be problematic. High moisture content degrades the bimorph actuators, wherein the bimorphs develop electrical problems and in certain situations stop functioning altogether (e.g., arcing across energized regions of the bimorph). More particularly, electrical malfunction is especially dangerous when bimorph actuators are used in combustible atmosphere (e.g., natural gas)—electrical arcing may result in ignition.

Attempts have been made to create moisture-proof piezoelectric bimorph actuators which are insulated to prevent arcing. However these attempts generally involved actuators having bonded monolithic packaging requiring that the actuator deform the entire packaging to operate. Furthermore, in gas transducers, operating temperatures range from about −40 to about 150 degrees Fahrenheit. The extreme temperatures expand and contract the packaging thereby constricting movement of the bimorph as well. This imparts a significant strain upon the actuator rendering the device inoperable.

Therefore, there is a need for a free-floating piezoelectric bimorph actuator which is substantially moisture impervious and electrically insulated as well as protected from extraneous strain stemming from deleterious effects of a monolithically formed bimorph package.

SUMMARY

The present disclosure provides for an actuator having a piezoelectric bimorph disposed within substantially moisture impervious and electrically insulating packaging. The bimorph is disposed within a cavity of the packaging and provides a predetermined clearance around the bimorph allowing the bimorph to move freely therein.

According to one aspect of the disclosure an actuator is disclosed. The actuator includes a piezoelectric bimorph and a substantially moisture impervious and electrically insulating packaging. The packaging defines a clearance cavity around the bimorph. The packaging includes a carrier having first and second surfaces and an aperture wherein the bimorph is disposed, the packaging further includes first and second cover films selectively attached to the first and second surfaces respectively, and at least one flex circuit connected to the bimorph for supplying electrical energy thereto.

According to another aspect of the disclosure a transducer is disclosed. The transducer includes a housing and an actuator. The actuator includes a piezoelectric bimorph and a substantially moisture impervious and electrically insulating packaging. The packaging defines a clearance cavity around the bimorph. The packaging includes a carrier having first and second surfaces and an aperture wherein the bimorph is disposed, the packaging further includes first and second cover films selectively attached to the first and second surfaces respectively, and at least one flex circuit connected to the bimorph for supplying electrical energy thereto.

According to a further aspect of the invention a method for manufacturing an actuator is disclosed. The method includes the steps of assembling a substantially moisture impervious and electrically insulating packaging comprising a carrier having first and second surfaces and an aperture. The method also includes the steps of selectively attaching a first cover film to the first surface, inserting a piezoelectric bimorph within the packaging, connecting at least one flex circuit to the bimorph for supplying electrical energy thereto, and selectively attaching a second cover film to the second surface to form a cavity around the bimorph providing for a clearance around the bimorph.

BRIEF DESCRIPTION OF THE DRAWINGS

The above and other aspects, features, and advantages of the present disclosure will become more apparent in light of the following detailed description when taken in conjunction with the accompanying drawings in which.

DETAILED DESCRIPTION

Specific embodiments of the present disclosure will be described herein below with reference to the accompanying drawings. In the following description, well-known functions or constructions are not described in detail to avoid obscuring the present disclosure in unnecessary detail.

It is desirable for actuators used in gas transducers to have minimal stress imparted thereon. The actuator must be free to move through its travel to control the stream of gas passing through the gas transducer. Therefore, the present disclosure provides for a piezoelectric bimorph actuator suitable for use in a gas transducer. More specifically, the bimorph actuator according to the present invention includes a free-floating packaged bimorph which is not affected by the movement of its packaging. Moreover, the packaging renders the actuator substantially moisture impervious and electrically insulated. Those skilled in the art will appreciate that the actuator of the present disclosure may have additional applications, such as in camera shutter mechanisms, and hard drive disk head assemblies.

The bimorph actuator includes a piezoelectric bimorph disposed within a packaging. The packaging includes a carrier having first and second surfaces and first and second cover films disposed on the first and second surfaces respectively. More specifically, the bimorph is disposed within an aperture of the carrier. The actuator further includes first and second adhesive layers disposed on the first and second surfaces of the carrier respectively so that the adhesive is not in contact with the bimorph. First and second flex circuits are disposed within the first and second adhesive layers and are configured to conduct electrical energy to the bimorph. The actuator also includes first and second cover films disposed on top of the first and second adhesive layers and the first and second flex circuits thereby encapsulating the bimorph. The packaging (e.g., the carrier and/or the cover films) forms a cavity around the bimorph of a predetermined size which provides for sufficient clearance around the bimorph. The clearance allows the bimorph not to be constricted by the packaging during extreme temperatures (e.g., thermal expansion of the carrier and/or cover films).

Figure 1:
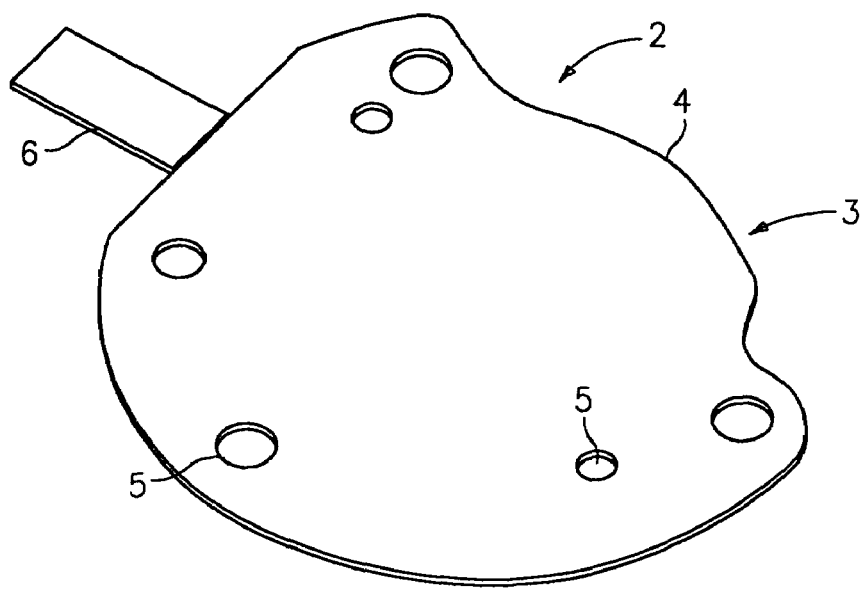
FIG. 1 is an isometric view of a piezoelectric bimorph actuator according to the present disclosure.
Figure 2:
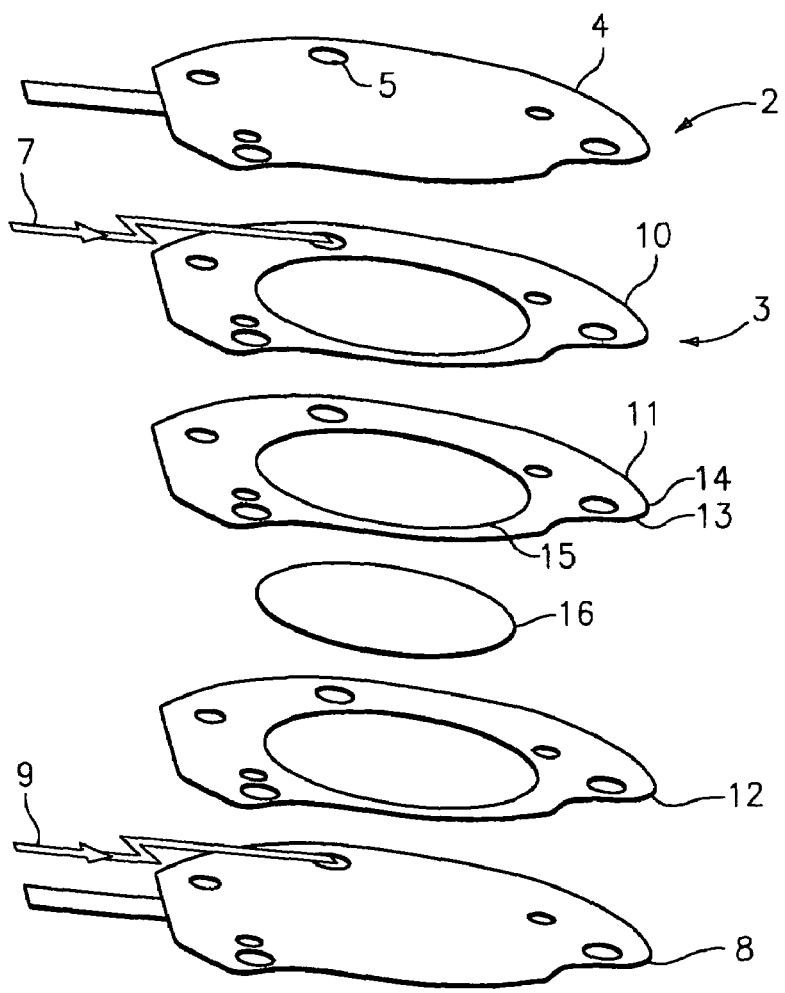
FIG. 2 is an exploded isometric view of the piezoelectric bimorph actuator according to the present disclosure.

FIG. 1 shows a fully-assembled piezoelectric bimorph actuator 2 having a packaging 3 which includes a first cover film 4 and a second cover film 8 as shown in FIG. 2. The packaging 3 includes a plurality of holes 5 which are used to attach the actuator 2 to a device (e.g., gas transducer) and/or during assembly of the packaging 3 (e.g., to attach the components of the packaging 3 together). The holes 5 are optional and it is envisioned that other mechanisms may be used to secure the actuator 2 to the transducer or other devices. It is also envisioned that the holes may be used for pressure equalization and/or for gas bypass. The actuator 2 also includes flex circuits 7, 9 as shown in FIG. 2.

The actuator 2 activates through the activation of the bimorph 16. More specifically, the flex circuits 7, 9 are in physical and/or electrical contact with the bimorph 16 and supply electrical energy thereto. Once the bimorph 16 receives electricity, the bimorph 16 is activated and affects the movement of the packaging 3. The flex circuits 7, 9 are sufficiently flexible and can maintain contact with the bimorph 16 during activation. The flex circuits 7, 9 may be die cut from copper foil of about 0.002" thickness.

With reference to FIG. 2, a piezoelectric bimorph 16 is disposed within the packaging 3, which includes a carrier 14 having first and second surfaces 11, 13, first and second adhesive layers 10, 12 disposed on the first and second surfaces 11, 13, and the aperture is of a predetermined size which provides for sufficient clearance around the bimorph 16 disposed on top of the first and second the cover films 4, 8 respectively. The bimorph 16 may be formed from a variety of piezoelectric materials, such as lead zirconate titanate (PZT), quartz, barium titanate, and the like. It is also envisioned that magnetostrictives and electrostrictives may be suitable.

Figure 3:
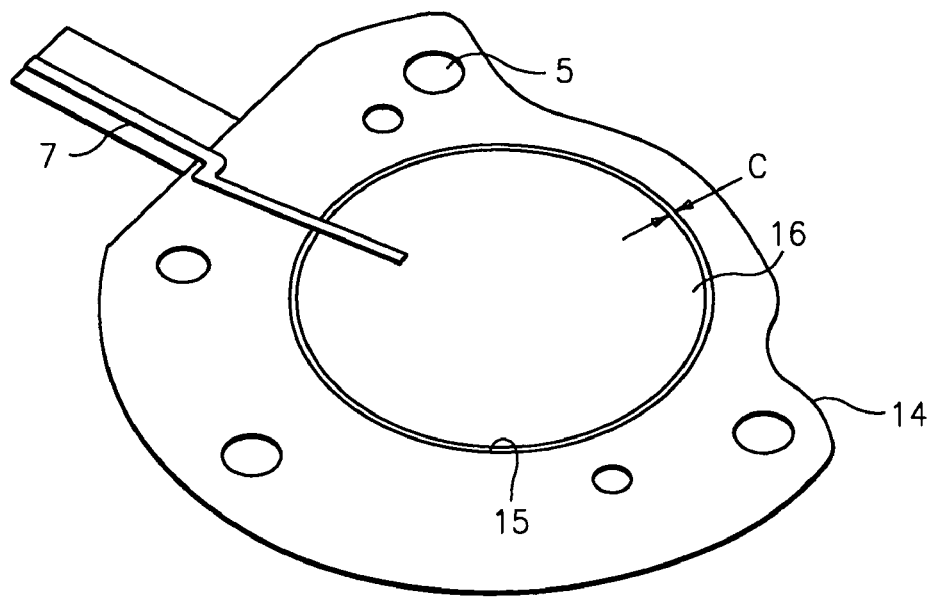
FIG. 3 is an isometric view of the piezoelectric bimorph within a carrier according to the present disclosure.
Figure 4:
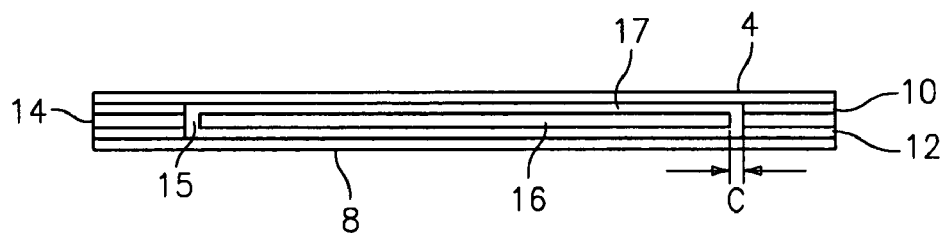
FIG. 4 is a cross-sectional view of the piezoelectric bimorph actuator according to the present disclosure.

More specifically, the bimorph 16 is disposed within an aperture 15 of the carrier 14 as shown in FIG. 3. The aperture 15 is of substantially the same shape as the bimorph 16 (e.g., circular) but the aperture 15 is sufficiently larger than the bimorph 16 to provide for a clearance "C" between the bimorph 16 and the carrier 14. The clearance "C" provides greater freedom of motion for the bimorph 16 (e.g., float freely ) within the carrier 14 and the packaging 3 since the bimorph 16 is not secured and/or attached to any of the components (e.g., carrier 14, the adhesive layers 10, 12, and the cover films 4, 8) of the packaging 3. Once the packaging 3 is assembled from the carrier 14 and the first and second cover films 4, 8 a cavity 17 is formed around the bimorph 16 as shown in FIG. 4.

With reference to FIG. 2, assembly of the actuator 2 will be discussed. The carrier 14 and the first and second cover films 4, 8 are formed from a suitable polymer (e.g., polymide laminate, polyester, Transilwrap™ corona treated 92 gauge Mylar, etc.) and are machined and/or stamped to produce the desired shape. The thickness of the carrier 14 depends on the thickness of the bimorph 16 and is from about 4 mil to about 100 mil. The thickness of the first and second cover films 4, 8 is from about ½ mil to about 5 mil.

In the embodiment shown in FIG. 2, the carrier 14 and the first and second cover films 4, 8 are machined and/or stamped to have a circular shape to encapsulate the bimorph 16 which has a circular shape. In addition, holes are created (e.g., drilled, stamped, etc.), through which attachment mechanisms (e.g., bolts) attach the actuator 2 to the intended device. The drilling step may be performed once the actuator 2 is fully assembled. Those skilled in the art will understand that the carrier 14 and the first and second cover films 4, 8 can be formed through plurality of processes (e.g., curtain extrusion to a film form, injection molding, casting, etc.). Furthermore, the holes 5 may be of different diameter to accommodate attachment mechanisms (e.g., bolts, rivets, etc.) of various sizes. This is particularly useful if the components of the packaging 3 (e.g., the carrier 14, the first and second cover films 4, 8, etc.) are attached to each other using various attachment mechanisms (e.g., bolts, rivets, etc.).

The carrier 14 is machined and/or stamped to create the aperture 15 of a predetermined size which provides for sufficient clearance "C" around the bimorph 16. The first cover film 4 is selectively attached to the carrier 14 using the first adhesive layer 10, to avoid attachment to the bimorph 16. The flex circuit 7 is adjacent to the bimorph 16 so that the flex circuit 7 is in physical and/or electrical contact with the bimorph 16. The flex circuit 7 is held between the first cover film 4 and the adhesive layers 10.

The bimorph 16 is inserted within the assembled portion of the packaging 3, namely the carrier 14 and the first cover film 4 attached together with the flex circuit 7 disposed between the cover film 4 and the adhesive layer 10. The flex circuits 7, 9 contact the bimorph 16 by way of the force developed on the cover films 4, 8 respectively. Since the aperture 15 is open to atmosphere at its distal end and the pressure within the transducer is greater than ambient, the cover films 4, 8 always press against the bimorph 16 thereby pushing the flex circuits 7, 9 against thereto. This eliminates the need for using adhesives or soldering to permanently attach the flex circuits 7, 9 to the bimorph simplifying the assembly process.

Thereafter, the second cover film 8 is selectively attached to the carrier 14, also to avoid attachment to the bimorph 16, at the second surface 13 via the second adhesive layer 12. The flex circuit 9 is disposed between the second surface 13 and the second cover film 8 and is in contact with the bimorph 16.

Those skilled in the art will appreciate that the assembly of the actuator 2 may be accomplished by attaching the first and second cover films 4, 8 in any order (e.g., attaching the second cover film 8 initially, inserting the bimorph 16 into the resulting portion, thereafter attaching the first cover film 4) and on any of the surfaces 11, 13. For instance, the adhesive layers 10, 12 may be tacked to the carrier 14

The adhesive layers 10, 12 may be formed from a thermal active adhesive or another type, such as thermally activated double sided laminating films (e.g., Transilwrap™ PAM K3 1/1/1). The first and second adhesive layers 10, 12 have substantially similar shape as the first and second surfaces 11, 13 of the carrier 14 to ensure that the adhesive layers 10, 12 selectively attach the carrier 14 to the first and second cover films 4, 8. Namely, that the carrier 14 and the first and second cover films 4, 8 are bonded to each other and not to the bimorph 16. This allows the bimorph 16 to be enclosed within the cavity 17 (FIG. 4). Consequently, the bimorph 16 is free to flex when electrically activated through the flex circuits 7, 9 and thereby effect (e.g., through flexing activate) the packaging 3, while packaging 3 cannot effect the movement of the bimorph 16 (e.g., through expansion or contraction affected by extreme temperatures).

When using the adhesive layers 10, 12 to assemble the packaging 3, the first and second cover films 4, 8 are not immediately bonded to the carrier 14 since the adhesive layers 10, 12 are thermally activated. Therefore, the cover films 4, 8 are temporarily attached to the carrier 14 and the adhesive layers 10, 12 (e.g., tacked). Thereafter, the assembled actuator is processed through a laminator operating at a temperature from about 180° F. to about 400° F. and at a pressure from about 5 psi to about 200 psi, ensuring that the temperature does not drop below the operational temperature of the bimorph 16 and does not exceed the Curie point while the pressure is not excessive and does not crack the bimorph 16. During this treatment the adhesive layers 10, 12 secure the flex circuits 7, 9 and the first and second cover films 4, 8 to the carrier 14, enclosing the bimorph 16 therein. The actuator 2 may be cooled and then machined to remove excess peripheral material. In addition, holes 5 may be drilled. The machining may be performed by a carbide end mill, rotating to produce at least 50 surface feet per minute.

Those skilled in the art will understand that the packaging 3 may be assembled using variety of other attachment mechanisms, such as for example rivets and/or bolts. The carrier 14 and the first and second cover films 4, 8 are selectively attached using attachment mechanisms so that the bimorph 16 is encapsulated by the packaging 3 within the cavity 17 without being attached to the carrier 14 and/or the first and second cover films 4, 8 as shown in FIG. 4.

Figure 5:
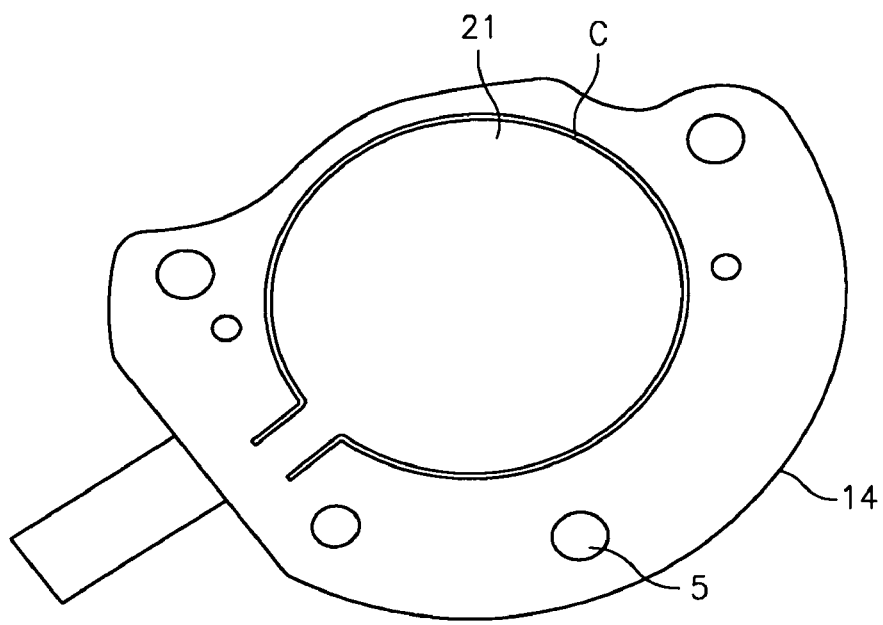
FIG. 5 is an isometric view of the carrier according to the present disclosure.

In other embodiments, as shown in FIG. 5, the carrier 14 may include a relief 21 cut therein to support the bimorph 16 (not shown). The relief 21 has the same shape as the bimorph 16, in the present embodiment, it is circular, in order to allow for mispositioning of the bimorph 16. The relief 21 is separated from the carrier 14 by the clearance "C" which allows the bimorph 16 not to be in contact with the side portions of the carrier 14.

Figure 6:
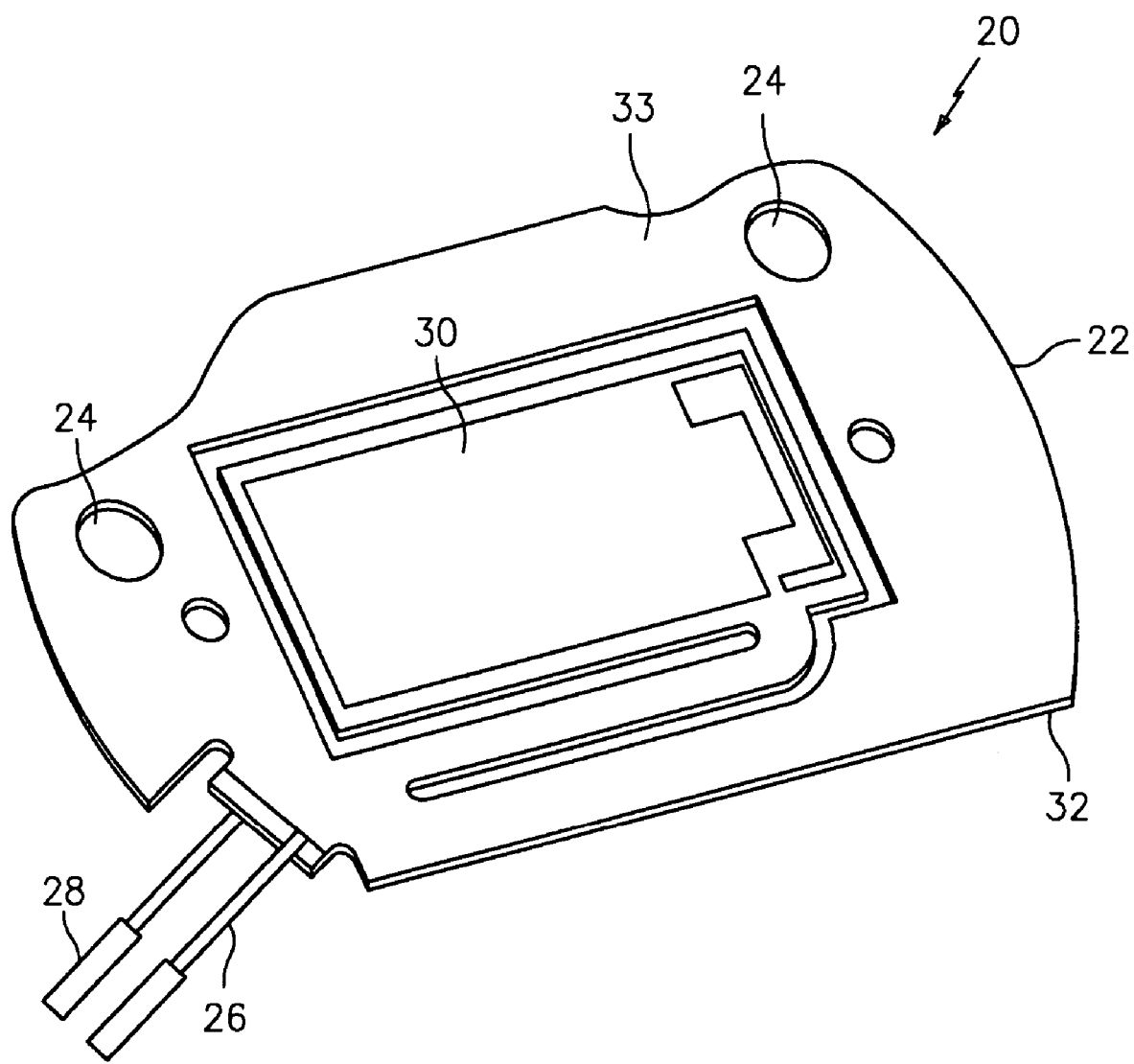
FIG. 6 is an isometric view of an alternate embodiment of a piezoelectric bimorph within a carrier according to the present disclosure.

Other shapes of the bimorph 16 and the packaging 3 and/or the actuator 2 as a whole are possible. As shown in FIG. 6, a rectangular bimorph 30 is inserted into a rectangular carrier 22. The carrier 22 and the first and second cover films (not shown), which are also rectangular, are assembled in substantially the same manner to form a rectangular actuator 20. More specifically, the first and second cover films are selectively attached to the carrier 22 using the first and second adhesive layers (not shown) which bond the first and second cover films to the first and second surfaces 32, 33 of the carrier 22, respectively. The adhesive layers also attach flex circuits 26, 28 to the actuator 20 and are connected to the bimorph 30. In addition, holes 24 are drilled through the actuator 20 allowing the actuator 20 to be mounted within a device or for other attachment mechanisms to be used to assemble the actuator 20.

The described embodiments of the present disclosure are intended to be illustrative rather than restrictive, and are not intended to represent every embodiment of the present disclosure. Various modifications and variations can be made without departing from the spirit or scope of the disclosure as set forth in the following claims both literally and in equivalents recognized in law.

What is claimed is:

1. An actuator comprising:
   a piezoelectric bimorph;
   a substantially moisture impervious and electrically insulating packaging comprising a cavity around the bimorph providing for a clearance around the bimorph, the packaging comprising a carrier having first and second surfaces and an aperture wherein the bimorph is disposed, the packaging further comprising first and second cover films selectively attached to the first and second surfaces respectively such that the bimorph is independent of the first and second cover films, wherein at least one of the first and second cover films is actuated upon activation of the bimorph; and
   at least one flex circuit connected to the bimorph for supplying electrical energy thereto.

2. An actuator as in claim 1, wherein first and second adhesive films selectively attach the first and second cover films to the first and second surfaces respectively.

3. An actuator as in claim 2, wherein the first and second adhesive films are formed from a thermal active adhesive.

4. An actuator as in claim 1, wherein at least one attachment mechanism attaches the first and second cover films to the first and second surfaces respectively.

5. An actuator as in claim 1, wherein the piezoelectric bimorph is formed from a material selected from the group of lead zirconate titanate, quartz, and barium titanate.

6. An actuator as in claim 1, wherein the carrier and the first and second cover films are formed from a polymer.

7. An actuator as in claim 6, wherein the polymer is polymide laminate.

8. An actuator as in claim 6, wherein the polymer is polyester.

9. A transducer comprising:
   a housing; and
   an actuator disposed within the housing, the actuator comprising:
   a piezoelectric bimorph;
   a substantially moisture impervious and electrically insulating packaging comprising a cavity around the bimorph providing for a clearance around the bimorph, the packaging comprising a carrier having first and second surfaces and an aperture wherein the bimorph is disposed, the packaging further comprising first and second cover films selectively attached to the first and second surfaces respectively such that the bimorph is independent of the first and second cover films, wherein at least one of the first and second cover films is actuated upon activation of the bimorph; and
   at least one flex circuit connected to the bimorph for supplying electrical energy thereto.

10. A transducer as in claim 9, wherein first and second adhesive films selectively attach the first and second cover films to the first and second surfaces respectively.

11. A transducer as in claim 10, wherein the first and second adhesive films are formed from a thermal active adhesive.

12. A transducer as in claim 9, wherein at least one attachment mechanism attaches the first and second cover films to the first and second surfaces respectively.

13. A transducer as in claim 9, wherein the piezoelectric bimorph is formed from a material selected from the group of lead zirconate titanate, quartz, and barium titanate.

14. A transducer as in claim 9, wherein the carrier and the first and second cover films are formed from a polymer.

15. A transducer as in claim 14, wherein the polymer is polymide laminate.

16. A transducer as in claim 14, wherein the polymer is polyester.

17. A transducer as in claim 9, wherein the packaging includes at least one hole for attachment to the housing.

18. A method for manufacturing an actuator:
assembling a substantially moisture impervious and electrically insulating packaging comprising a carrier having first and second surfaces and an aperture,
selectively attaching a first cover film to the first surface;
inserting a piezoelectric bimorph within the packaging;
connecting at least one flex circuit to the bimorph for supplying electrical energy thereto; and
selectively attaching a second cover film to the second surface to form a cavity around the bimorph providing for a clearance around the bimorph such that the bimorph is independent of the first and second cover films, wherein at least one of the first and second cover films is actuated upon activation of the bimorph.

19. A method as in claim 18, wherein first and second adhesive films selectively attach the first and second cover films to the first and second surfaces respectively.

20. A method as in claim 19, wherein the first and second adhesive films are formed from a thermal active adhesive.

21. A method as in claim 18, wherein at least one attachment mechanism attaches the first and second cover films to the first and second surfaces respectively.

22. A method as in claim 18, wherein the piezoelectric bimorph is formed from a material selected from the group of lead zirconate titanate, quartz, and barium titanate.

23. A method as in claim 18, wherein the carrier and the first and second cover films are formed from a polymer.

24. A method as in claim 23, wherein the polymer is polymide laminate.

25. A method as in claim 23, wherein the polymer is polyester.

* * * * *